US008434025B2

(12) United States Patent
Fisher et al.

(10) Patent No.: US 8,434,025 B2
(45) Date of Patent: Apr. 30, 2013

(54) OPHTHALMIC LENS DESIGN AND/OR DISPENSING (75) Inventors: Scott Warren Fisher, Flagstaff Hill (AU); Saulius Raymond Varnas, Brighton (AU); Philipp Ellinger, Hallett Cove (AU); Michael Alan Morris, Santa Rosa, CA (US); Ray Steven Spratt, Petaluma, CA (US); Timo Kratzer, Aalen (DE)

(73) Assignee: Carl Zeiss Vision Australia Holdings Limited, Lonsdale, South Australia (AU)

( * ) Notice: Subject to any disclaimer, the term of this patent is extended or adjusted under 35 U.S.C. 154(b) by 986 days.

(21) Appl. No.: 12/093,665

(22) PCT Filed: Nov. 15, 2006

(86) PCT No.: PCT/AU2006/001701
§ 371 (c)(1),
(2), (4) Date: Jul. 23, 2008

(87) PCT Pub. No.: WO2007/056797
PCT Pub. Date: May 24, 2007

(65) Prior Publication Data
US 2008/0282183 A1 Nov. 13, 2008

(30) Foreign Application Priority Data
Nov. 15, 2005 (AU) ................................. 2005906319

(51) Int. Cl.
*G06F 3/048* (2006.01)
*G06C 3/00* (2006.01)
(52) U.S. Cl.
USPC ....................... 715/833; 715/813; 351/159.74
(58) Field of Classification Search .................. 715/771, 715/810, 826, 833, 964, 974, 711, 812–813, 715/816; 351/177, 159.74–159.77
See application file for complete search history.

(56) References Cited

U.S. PATENT DOCUMENTS 5,226,118 A * 7/1993 Baker et al. .................... 715/833
5,452,031 A    9/1995 Ducharme
(Continued)

FOREIGN PATENT DOCUMENTS

EP    1 468 649 A1    10/2004
EP    1 515 179 A1    3/2005
(Continued)

OTHER PUBLICATIONS

Meister, "Optics of Progressive Lenses", http://www.opticampus.com/cecourse.php?url=progressive_lenses/, as evidenced by Internet Archive, http://web.archive.org/web/20060323145307/http://www.opticampus.com/cecourse.php?url=progressive_lenses, Mar. 23, 2006, pp. 1-19.*

(Continued)

*Primary Examiner* — Omar Abdul-Ali
*Assistant Examiner* — Andrew Tank
(74) *Attorney, Agent, or Firm* — Buchanan Ingersoll & Rooney PC (57) ABSTRACT A method of designing and/or selecting a progressive addition lens design for a wearer is disclosed. In an embodiment, the method includes displaying a graphical representation of an initial progressive addition lens design including design parameters having design values. A user interface is provided including, for each of one or more of the design parameters, a control that is adjustable over a range of levels, each level in the range being associated with a corresponding value of the respective design parameter. A control is adjusted to select a level and the selection is processed so as to substantially simultaneously update the displayed graphical representation in accordance with the selected level to provide a modified progressive lens design. A system for designing and/or selecting a progressive addition lens design for a wearer is also disclosed.

15 Claims, 8 Drawing Sheets

U.S. PATENT DOCUMENTS

| | | | |
|---|---|---|---|
| 5,615,347 A * | 3/1997 | Davis et al. | 715/833 |
| 6,241,355 B1 * | 6/2001 | Barsky | 351/177 |
| 6,751,522 B2 * | 6/2004 | Okada et al. | 700/164 |
| 7,090,348 B2 * | 8/2006 | Nason et al. | 351/177 |
| 7,540,611 B2 | 6/2009 | Welk et al. | |
| 2003/0107707 A1 * | 6/2003 | Fisher et al. | 351/177 |

FOREIGN PATENT DOCUMENTS

| | | |
|---|---|---|
| JP | 11-120213 A | 4/1999 |
| JP | 2000-020580 A | 1/2000 |
| JP | 2003-132096 A | 5/2003 |
| WO | 03/019269 A2 | 3/2003 |
| WO | WO 03/087889 A2 | 10/2003 |
| WO | WO 2004/046792 A1 | 6/2004 |

OTHER PUBLICATIONS

Santosa, "Ophtima: An Optimization Based Progressive Lens Design Tool", http://www.math.umn..edu/~santosa/ophtima.html, as evidenced by Internet Archive http://web.archive.org/web/20050305174317/http://www.math.umn.edu/~santosa/ophtima.html on Mar. 5, 2005, pp. 1-4.*

Supplementary Partial European Search Report, dated Dec. 13, 2010.

Examination Report from the European Patent Office, dated Jan. 20, 2011.

Form PCT/ISA/210 (International Search Report) dated Jan. 25, 2007.

\* cited by examiner

OPHTHALMIC LENS DESIGN AND/OR DISPENSING

This application claims priority from Australian Provisional Patent Application No. 2005906319 filed on 15 Nov. 2005, the contents of which are to be taken as incorporated herein by this reference.

FIELD OF THE INVENTION

The present invention relates to the design and/or dispensing of ophthalmic lenses and in particular to the design and/or dispensing of progressive addition ophthalmic lenses. In a typical application, the present invention may be used by an optometrist to design and/or dispense a progressive addition lens design for a wearer.

BACKGROUND OF THE INVENTION

Conventional progressive addition lenses are one-piece lenses having an upper viewing zone ('the distance zone'), a lower viewing zone ('the near zone'), and a progressive corridor ('the intermediate zone') extending between the distance zone and the near zone. The corridor provides a gradual power progression from the distance zone to the near zone without any dividing line or prismatic jump.

Although early progressive addition lenses were somewhat crude in design, they have consistently improved in performance over the past few decades. The improvement in performance has been a causative factor in significantly increasing patient demand for these categories of lenses to the point where lens dispensers and manufacturers today offer a large number of different progressive lens designs. There is thus available to a dispenser a large number of lens designs that may be dispensed to a wearer.

Typically, dispensing a progressive addition lens wearer involves a dispenser, such as an optometrist, selecting a particular progressive addition lens design from a range of semi-finished progressive lens designs.

A dispensing process that starts with the selection of a semi-finished lens, typically involves a dispenser selecting a series of progressive addition lens designs having a base curve that corresponds to the wearer's requirements, and then selecting, from within that series, a progressive addition lens design having an addition power that is suitable for the wearer. The selected semi-finished lens is then finished, by adding a prescription surface, to provide a finished progressive ophthalmic lens that meets the wearer's prescription requirements.

Since different wearer's experience different levels of presbyopia, different series of semi-finished lenses are provided for different addition powers, typically from 0.75 D to 3.50 D in 0.25 D increments (that is, twelve different lens designs for each series). Furthermore, a single product intended as a general purpose solution for presbyopia needs to be able to correct vision for a wide range of prescriptions, typically between −10.00 D and +6.00 D or more. However, since a single base curve can ensure satisfactory optics only over a range of prescription powers much narrower than is required, lens manufacturers typically create a range of lens series or base curves to satisfy this requirement. Indeed, typically, there may between four and eight lens series in a progressive addition lens (PAL) product.

There may thus be a large number of progressive addition lens designs that are able to be dispensed by a dispenser. Such a large number of designs complicates the dispensing process. The situation is exacerbated further as a result of different lens manufacturers providing different lens products and series. As a result, in dispensing a particular design for a wearer a dispenser must select a particular design from a range of different designs.

Alternatively, recent progressive addition lens designs provide a 'freeform' product where the progressive addition lens design is uniquely generated in response to customer needs. Here the selection of a particular design will often be out of the control of the optometrist or dispenser.

It is an aim of the present invention to provide a system and/or method that assists the dispenser in dispensing and/or designing a progressive lens design for a patient.

SUMMARY OF THE INVENTION

The present invention provides a method of designing and/or selecting a progressive addition lens design for a wearer, the method including: displaying a graphical representation of an initial progressive addition lens design including design parameters having design values; providing a user interface including, for each of one or more of the design parameters, a control that is adjustable over a range of levels, each level in the range being associated with a corresponding value of the respective design parameter; adjusting a control to select a level; and processing the selection to substantially simultaneously update the displayed graphical representation in accordance with the selected level to provide a modified progressive lens design.

In an embodiment, the displayed graphical representation of the initial progressive addition lens design, or the modified progressive addition lens design, is a graphical representation of a contour plot. As will be appreciated, a contour plot provides a two-dimensional map representing either the power distribution, or astigmatism, of a progressive addition lens design as lines of equal iso-power or iso-astigmatism respectively. In another embodiment, the graphical representation is a power profile plot providing a curve representing power progression along a lens meridian extending between the distance zone and the near zone.

The initial progressive addition lens design may have default design values that do not have any particular significance other than by way of providing an initial set of design values for commencing the design and/or selection. Alternatively, the initial progressive addition lens design may be a progressive addition lens design having design parameters with initial design values that are "close" to a desired lens design. In such an embodiment, the initial design values may be selected as a set of design values for a progressive lens design having design parameters that approximate a wearer's requirements, with the method then being applied to adjust those parameters.

The one or more design parameters for which a control is provided may include one or more of:
(a) distance zone area;
(b) near zone area;
(c) corridor length;
(d) distance-near zone size balance;
(e) near point inset;
(f) blur gradients; and
(g) foveal-peripheral zone size balance.

It is to be appreciated that the present invention is not limited to the above design parameters. Indeed, embodiments of the invention may permit variation of other than the design parameters listed.

In an embodiment, each control is associated with a scale representing the range of levels over which the control can be adjusted. An embodiment that includes a scale is expected to provide additional advantages in that it will provide the user with an ability to observe a representation of the scope of available adjustment above and below the current level selection.

In such an embodiment, an adjustment of a control entails adjusting the position of the control relative to the scale. The scale may include a quantised scale. For example, the scale may be a linear scale having discrete levels that are selectable using a respective control. In such an embodiment, each control may be adjustable over the range of levels represented by the scale to select a discrete level from within the range. Each discrete level represented in the scale may be identified with an indicator indicating the magnitude of the level, or the magnitude of the associated design parameter value.

In an alternative embodiment, each control may be associated with an indicator indicating the current level selection. In such a case, the current level selection may be indicated in terms of the relative magnitude of the level, or the corresponding value of the associated design parameter, or it may be specified in other ways such as, for example, a proportional indication. The relative magnitude of the level may be indicated qualitatively (for example, as 'high', 'medium' or 'low' level) or quantitatively (for example, as a numerical range).

Adjusting a control will typically entail a user manipulating the control to vary a value of a respective design parameter of the displayed progressive addition lens design.

In one embodiment, the user interface includes a graphical user interface (GUI) including controls that are displayed on a display device that also displays the graphical representations of the initial and modified progressive addition lens designs. In such an embodiment, each control may be displayed in the form of user adjustable graphical control included within GUI. Such a GUI may be built using conventional software development systems, such as "Visual Basic", and may include controls such as those provided in a "Windows" type application interface, including for example, buttons, tick-boxes, check-boxes, slider bars, a resizable bar graph, a pull down list and the like. It will be understood that other suitable types of controls would be known to a skilled person.

In an alternative embodiment, the user interface may include an input device, such as a hardware and/or software device, that is separate to the display device but communicatively coupled to a computer system performing the processing of the level selections. For example, the controls may be provided on a user interface comprising a control panel including controls in the form of switches (such as rotational switches), dials, buttons, knobs, or the like that are communicatively coupled to the computer system by a suitable communications interface or infrastructure.

In an embodiment, the processing of the level selection to substantially simultaneously update the displayed representation of the progressive lens design in accordance with the level selection(s) includes processing the selection so as to automatically adjust the other controls, in accordance with the level selection. Thus, in such an embodiment, the controls associated with the one or more of the design parameters may be automatically adjusted, as a result of the processing, in accordance with the user adjustment. In this respect, although progressive addition lens designs are often parameterised in terms of zone sizes, blur gradients, corridor length, inset and peripheral astigmatism, for example, these are not necessarily independent parameters. Those skilled in the art of lens design will be aware that to produce a successful progressive addition lens certain trade-off in design parameters must be carefully considered. Thus, an embodiment that processes the level selection for a design parameter so as to automatically adjust the controls associated with the other design parameters may provide further advantages. For example, one embodiment of the present invention may reflect the expert knowledge of those skilled in the art. For example, an embodiment may automatically adjust the controls in response to a level selection by the user so as to prevent the user from designing and/or selecting a progressive addition lens designs that is outside the acceptable limits for any one or combination of design parameters, or warn the user that the design is radical with respect to the art.

In an embodiment, the automatic adjustment of the controls in accordance with the level selection of one of the controls, may restrict the range of selectable levels for the other controls, and thus the associated one or more design parameters, based on the user level selection(s). Alternatively the user may select design parameters that can be 'traded' as a target design parameter is manipulated, in order to maintain other desirable features in the progressive lens design.

The processing of the level selection to substantially simultaneously update the displayed representation of the progressive lens design in accordance with the adjustment of the control may include selecting, for display, a graphical representation of an existing progressive addition lens design. An existing progressive lens design may be selected from an array of progressive addition lens designs in accordance with the control levels, or the design parameter values attributable to the level selection(s). In other words, in such an embodiment the selected progressive addition lens design may include progressive addition lens design that has been selected from the array in accordance with the setting of the one or more controls. In such an embodiment, the array may include progressive addition lens designs having design parameter values having a predetermined relationship with the selected control levels.

In another embodiment, the processing of the level selections to substantially simultaneously update the displayed representation of the progressive lens design in accordance with the level selections, includes generating a graphical representation of the modified progressive addition lens design by manipulating the initial progressive addition lens design in accordance with the level selections so as to generate the updated displayed representation in accordance therewith. Such a manipulation will typically involve a mathematical manipulation that applies, for example 'morphing' techniques.

It will thus be appreciated that the present invention provides a dispenser/optometrist/eye care professional with a lens-design software tool that enables them to select and/or design a progressive addition lens design by adjusting, and thus manipulating, one or more controls associated with a design parameter for a progressive addition lens design. The controls map onto one or more design parameters and thus can be adjusted to provide a progressive addition lens design that matches the needs of the wearer.

The decision on how a progressive addition lens design should be designed and/or selected may be guided from other inputs such as the visual behaviour patterns of a patient, patient lifestyle analysis or the user's own experiences/ideas. In this way the application software could be "non-automated" with 100% user variation of design parameters, or partially automated with some parameter values being obtained from other dispensing tools and/or measurement devices.

The present invention also provides a system for designing and/or selecting a progressive addition lens design for a wearer, the system including processor and associated memory device for storing a series of instructions to cause the processor to: displaying a graphical representation of an initial progressive addition lens design including design parameters having design values; provide a user interface including, for each of one or more of the design parameters, a control that is adjustable over a range of levels, each level in the range being associated with a corresponding value of the respective design parameter; receive a user input for an adjustment of a control to select a level; and process the selection to substantially simultaneously update the displayed graphical representation in accordance with the selected level to provide a modified progressive lens design.

The present invention also provides computer software for use in a system for designing and/or selecting a progressive addition lens design for a wearer, the system comprising a processor and associated memory device for storing the computer software including a series of instructions to cause the processor to: display a graphical representation of an initial progressive addition lens design including design parameters having design values; provide a user interface including, for each of one or more of the design parameters, a control that is adjustable over a range of levels, each level in the range being associated with a corresponding value of the respective design parameter; receive a user input for an adjustment of a control to select a level; and process the selection to substantially simultaneously update the displayed graphical representation in accordance with the selected level to provide a modified progressive lens design.

It will be recognised that the present invention includes a number of advantages in that the invention is able to be used by a dispenser to design and/or select a progressive ophthalmic lens by interactively varying design parameter values whilst simultaneously displaying a graphical representation of the resultant progressive addition lens design. In other words, the present invention may allow a user to observe the effect of adjustments to the design parameter values during the dispensing process.

The present invention may be implemented as a stand-alone tool that allows end-users to save and share output files so that a user-community can develop, based around the application of the preset invention, and output files can be shared and/or swapped. Such a sharing process may be supported by on-line access to a data-base of designs, or a bulletin board style community of users.

BRIEF DESCRIPTION OF THE DRAWINGS

The present invention will now be described in relation to a preferred embodiment as illustrated in the accompanying drawings. However, it must be appreciated that the matter illustrated presents only one technique for embodying the invention. Other configurations and arrangements are envisaged as also being within the scope of the invention as generally described above.

In the drawings.

DETAILED DESCRIPTION OF EMBODIMENTS

Figure 1:
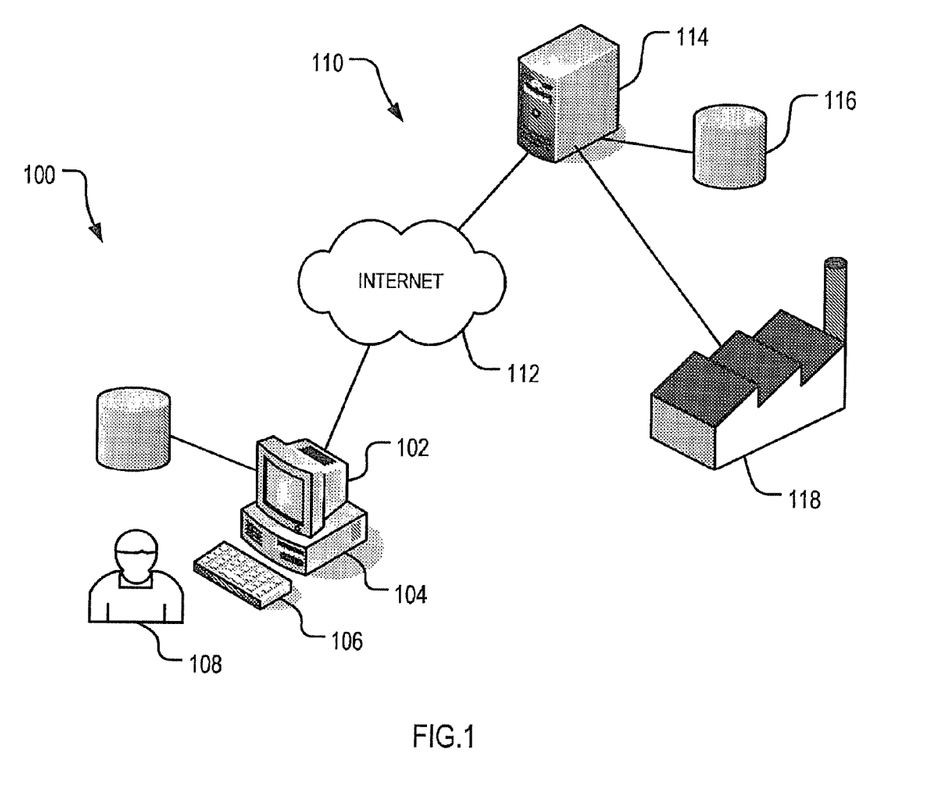
FIG. 1 shows a system in accordance with an embodiment of the present invention.

Referring initially to FIG. 1 there is shown an example of a computer enabled system 100 for designing and/or selecting a progressive addition lens design for a wearer in accordance with an embodiment of the present invention. In a first embodiment, the system 100 includes a display 102, a programmed computer 104, and an input device 106.

The display 102 may be any form of conventional graphics display and may include, for example a 1024×768 VGA video display including a suitable video interface standard for communicating with a graphics controller installed on the programmed computer 104.

The programmed computer 104 may include a conventional IBM compatible type computer equipped with a suitable operating system and application software. An example of a programmed computer 104 will be described in more detail later.

The input device 106 may include any suitable input device, such as a mouse, trackball, touch screen, joystick, keyboard or the like. The input device 106 permits a user 108 to manipulate a displayed representation of an initial progressive lens design, as displayed on the display 102, by adjusting controls that are associated with different design parameters of the displayed progressive addition lens design.

The display 102, the programmed computer 104 and the input device 106 are interconnected by way of suitable communications interfaces.

Figure 2:
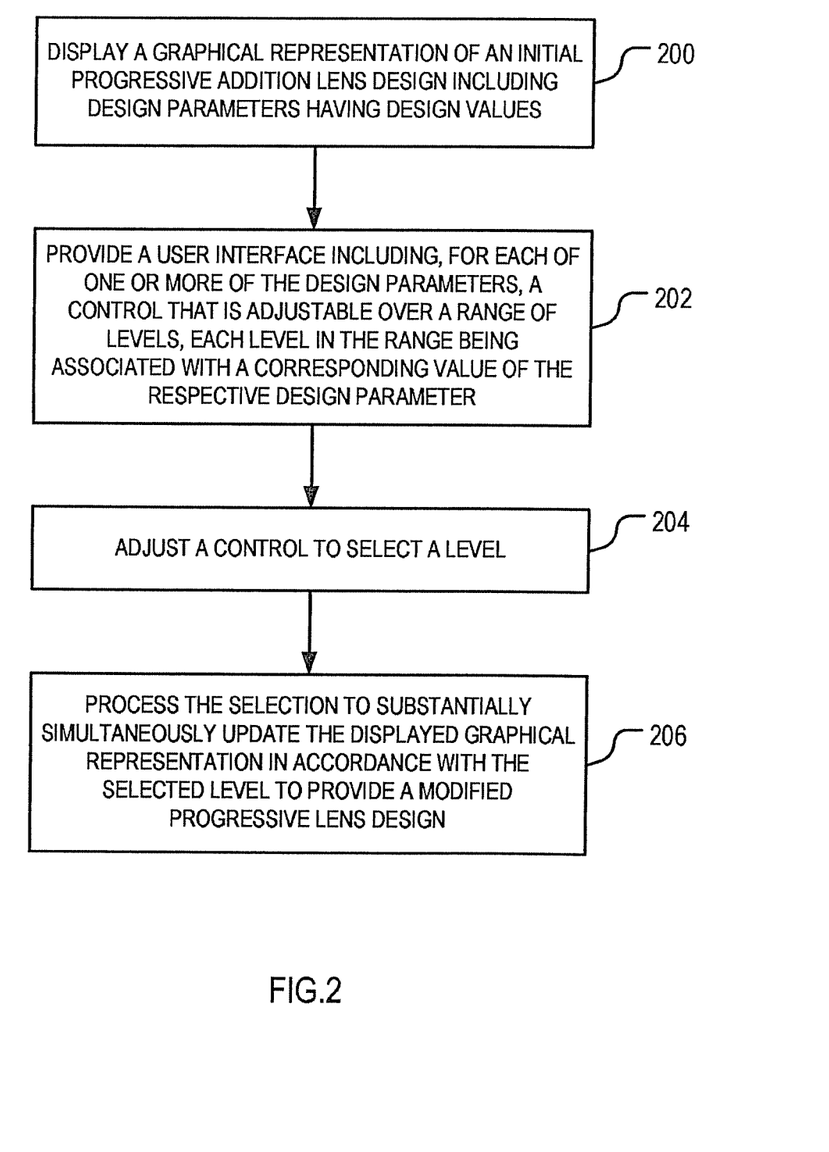
FIG. 2 shows a flow diagram for a method in accordance with a method embodiment of the present invention.

In use, and referring now to FIG. 2, at step 200 the display 102 (ref. FIG. 1) displays a graphical representation of an initial progressive addition lens design including design parameters having design values.

At step 202, a user interface is provided including, for each of one or more of the design parameters, a control that is adjustable over a range of levels, each level in the range being associated with a corresponding value of the respective design parameter. The user interface will typically include graphical elements that are displayed on the display 102, and that are manipulable using the input device 106.

At step 204, the control is adjusted to select a particular level.

At step 206, the selection is processed to substantially simultaneously update the displayed graphical representation in accordance with the selected level to provide a modified progressive lens design.

In the present case, the system 100 provides a modified progressive addition lens design in the form of an output file containing information that encapsulates the modified progressive addition lens design.

Referring again to FIG. 1 there is shown an alternative embodiment that includes a computer network 110. The illustrated network 110 includes a communications network 112

(shown as the Internet), and a server 114. The server may be in communication with a database 116 or a lens manufacturing facility 118. Thus, in the present case, the alternative embodiment is operable to communicate an output file from the programmed computer 104 to either the database 116 for storage, or to the lens manufacturing facility 116 for manufacture of the modified progressive addition lens design.

Turning now to FIG. 3 to FIG. 7 there are shown different sequences of screen shots of a user interface in the form of a graphical user interfaces (GUI) for use with an embodiment of the present invention.

Figure 3:
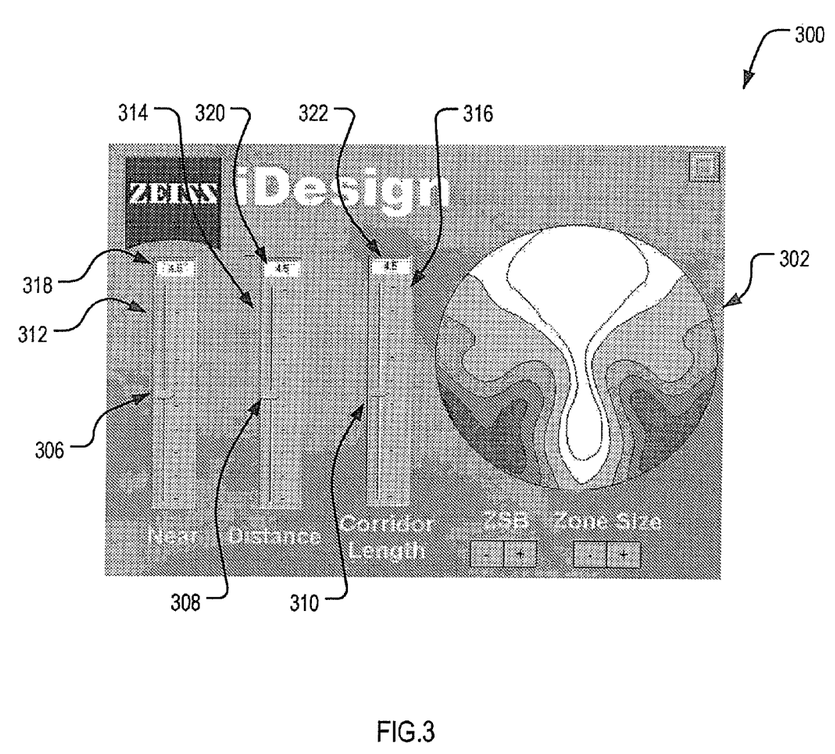
FIG. 3 is a screen image of a user interface suitable for use with the embodiment depicted in FIG. 1.

Referring initially to FIG. 3, there is shown an example of a graphical user interface 300 including a display of an initial progressive addition lens design 302 together with three controls 306, 308, 310.

In the present case, the controls 306, 308, 310 are provided for respective design parameters including a near zone area ('Near'), distance zone area ('Distance'), corridor length 310 ('Corridor Length').

The illustrated graphical representation 302 is a contour plot providing a two-dimensional map representing the power distribution each progressive addition lens design as lines of equal iso-power. Thus, in this example, the updating of the displayed progressive addition lens design 302 includes retrieving, from program memory, an image file of a modified progressive addition lens design having design parameters with values that have been selected on the basis of the settings of the controls 306, 308, 310, and thus that depend on the level selection(s).

Each of the controls 306, 308, 310 are adjustable over the range of levels by adjusting the position of the controls 306, 308, 310 along a respective scale 312, 314, 316. In the present case, each control is adjustable over a numerical range of levels in the range of '0 to 9', in 0.5 increments. For each control 306, 308, 310, a respective indicator 318, 320, 322 is provided for indicating, to the user, the current level selected by a respective control 306, 308, 310. It will be appreciated that other types of controls may also be used.

In use, each adjustment of a control 306, 308, 310 is processed by the programmed computer 104 to substantially simultaneously update the displayed representation 302 in accordance with the adjustment of the controls 304, and thus the level selection(s).

Figure 4:
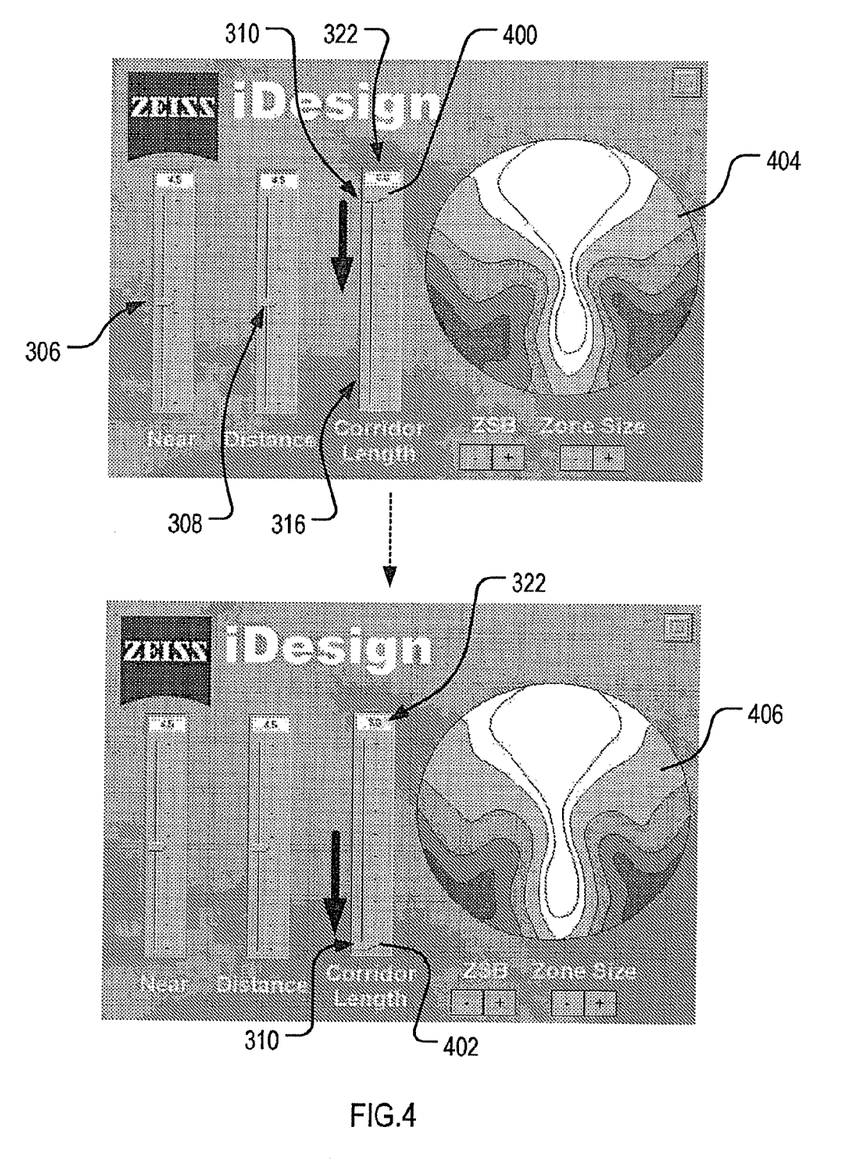
FIG. 4 is a sequence of screen images of the user interface depicted in FIG. 3 showing an example of the updating of a displayed graphical representation of an initial progressive addition lens design.

For example, with reference now to FIG. 4 there is shown the same user interface as that depicted in FIG. 3, but including a graphical representation 404 of an initial progressive addition lens design including design parameters having design values corresponding to the setting of the controls 306, 308, 310.

In the present case, the FIG. 4 depicts an example of an adjustment of the control 310 from a minimum level 400 (that is, '0') to a maximum level 402 (that is, '9') of the scale 316. Since the control 310 is associated with the corridor length design parameter, adjustments to the control 310 are processed to substantially simultaneously display an updated graphical representation 404 having a corridor length that varies according to the selected level. During an adjustment the current level selection is displayed by indicator 322.

Figure 5:
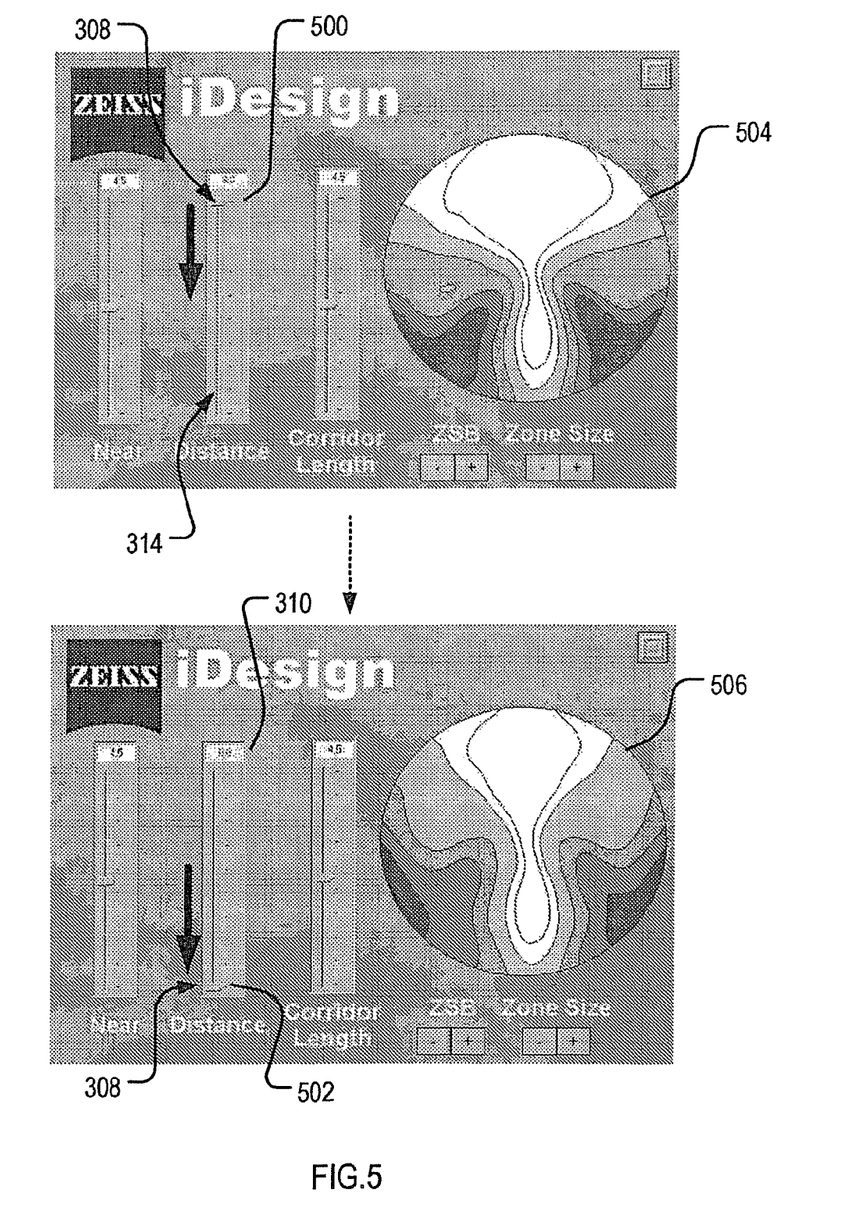
FIG. 5 is a sequence of screen images of the user interface depicted in FIG. 3 showing another example of the updating of a displayed graphical representation of an initial progressive addition lens design.

With reference now to FIG. 5 there is shown an example of an adjustment of the control 308 from a maximum level 500 to a minimum level 502 of the scale 314. In this example, since the control 308 is associated with the distance zone area design parameter, adjustments to the control 308 are processed to substantially simultaneously display a graphical representation 506 having a distance zone area that varies according to the selected level and thus that has a different distance zone area to that represented in the graphical representation 504 of the initial progressive addition lens design.

Figure 6:
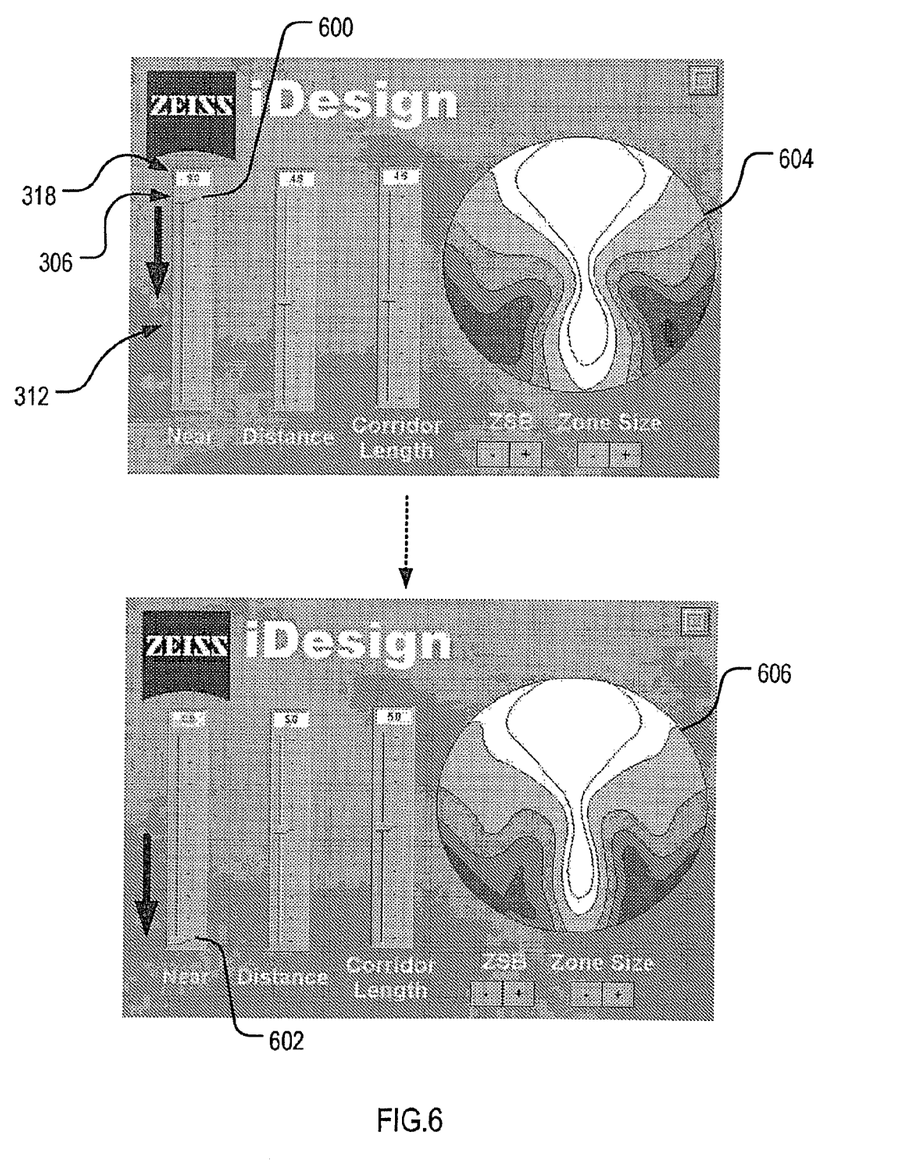
FIG. 6 is a sequence of screen images of the user interface depicted in FIG. 3 showing another example of the updating of a displayed graphical representation of an initial progressive addition lens design.

Turning now to FIG. 6 there is shown an example of an adjustment of the control 306 from a maximum level 600 to a minimum level 602 of the scale 312. In this example, since the control 312 is associated with the near zone area design parameter, adjustments to the control 312 are processed to substantially simultaneously display a graphical representation 606 having a near zone area that varies according to the selected level and thus that has a different near zone area to that represented in the graphical representation 604 of the initial progressive addition lens design.

Figure 7:
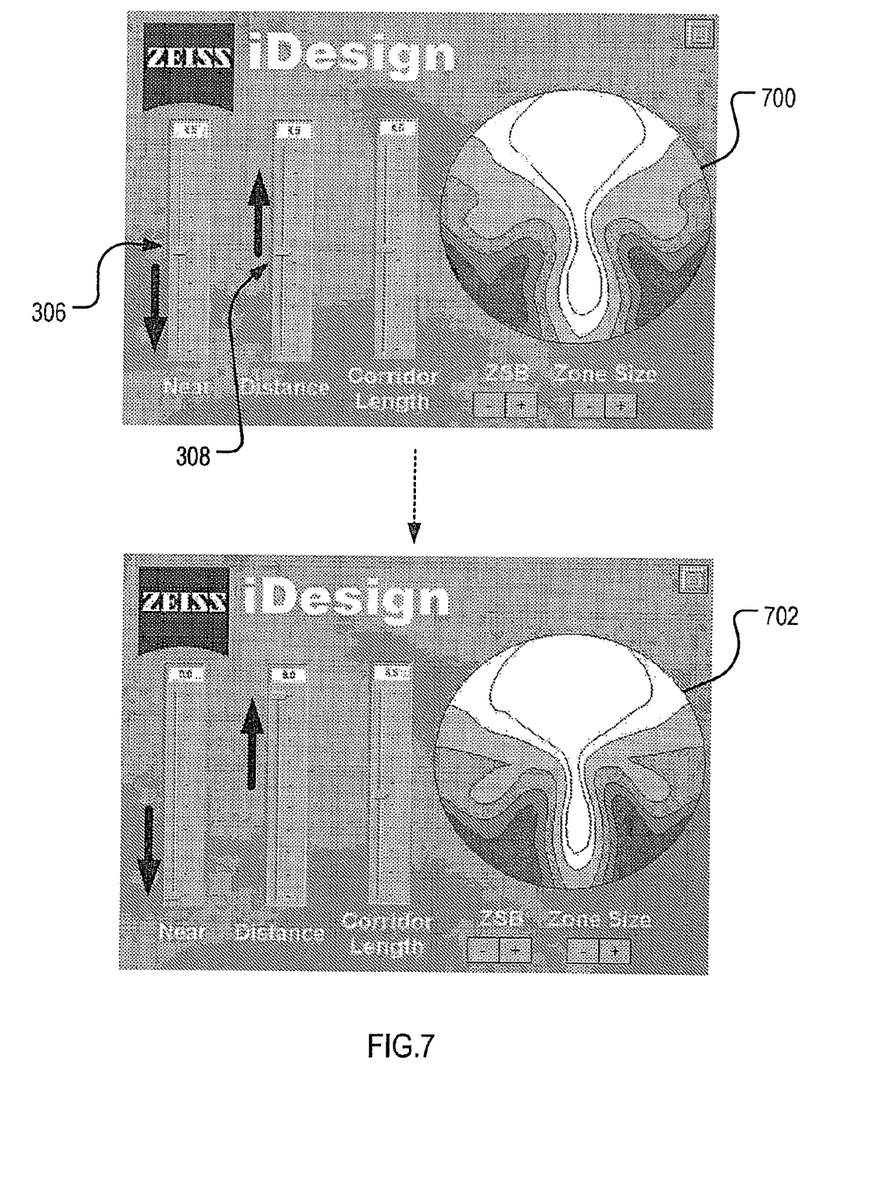
FIG. 7 is a sequence of screen images of the user interface depicted in FIG. 3 showing another example of the updating of a displayed graphical representation of an initial progressive addition lens design.
Figure 8:
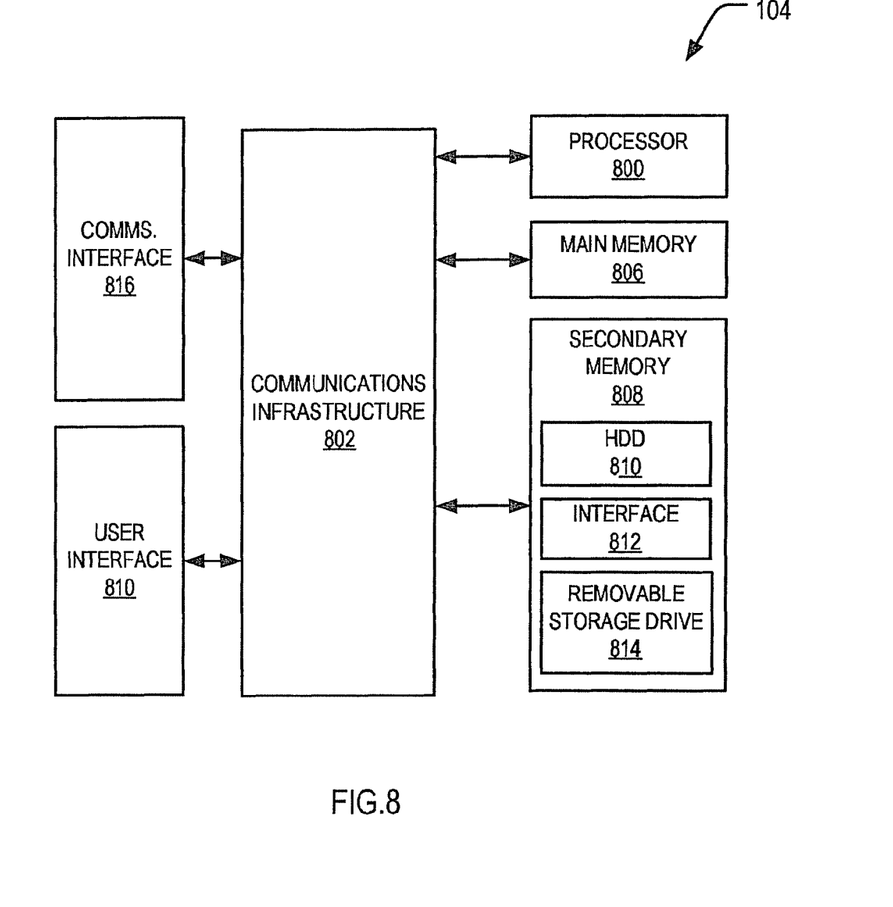
FIG. 8 is a block diagram of a computer system suitable for use with the system embodiment shown in FIG. 1.

FIG. 7 shows an example of a dual adjustment involving controls 306, 308 and the resultant updating of a graphical representation 700 for an initial progressive addition lens design to provide an updated representation of a modified progressive addition lens design 702.

The updating of a displayed graphical representation for an initial progressive addition lens design will typically include indexing either the selected levels, or the design values for the design parameters associated with the selected levels, into an array of pre-existing progressive addition lenses so as to select therefrom an indexed progressive addition lens design. Such an array may be constructed in a known manner.

The dimension of the array will vary according to the number of controls provided by the user interface. For example, in an embodiment in which three controls are provided, and thus three design parameters are adjustable, the array will be in the form of a three-dimensional array that is indexable using design values for the respective design parameters, as set by the respective controls, so as to retrieve an indexed progressive addition lens design. It will be understood that different numbers of controls may be used to index into correspondingly dimensioned arrays.

In another embodiment, the updating of the displayed graphical representation will include 'morphing' the displayed graphical representation of the initial progressive lens into a displayed graphical representation for a modified progressive addition lens design that has been derived by way of a 'morphing process' on the basis of the level selection(s). A suitable technique for conducting such a "morphing" process is described in International patent application PCT/AU2003/001555, the contents of which are to be taken as herein incorporated by reference.

After the user has settled on a particular design, the system 100 (ref. FIG. 1) according to the present invention provides an output file that may be used by a lens manufacturing facility 118 (ref. FIG. 1) to produce a progressive addition lens having the particular progressive addition lens design.

Referring now to FIG. 7, the programmed computer 106 includes one or more processors, such as processor 800. The processor 800 is connected to a communication infrastructure 802, such as a bus.

The programmed computer 106 also includes a main memory 806, preferably random access memory, and may also include a secondary memory 808.

The secondary memory 808 may include, for example, a hard disk drive, magnetic tape drive, optical disk drive, etc. The removable storage drive 814 reads from and/or writes to a removable storage unit (not shown) in a well known manner. The removable storage unit represents a floppy disk, magnetic tape, optical disk, etc.

As will be appreciated, the removable storage unit includes a computer usable storage medium having stored therein computer software in a form of a simulation engine comprising a series of instructions to cause the processor 800 to carry out desired functionality. In alternative embodiments, the secondary memory 808 may include other similar means for allowing computer programs or instructions to be loaded into the computer system 106. Such means may include, for example, a removable storage unit (such as an external USB storage device) and interface 812.

The computer system 106 may also include a communications interface 816. Communications interface 816 allows software and data to be transferred between the computer system 106 and external devices. Examples of communication interface 816 may include a modem, a network interface, a communications port, a PCMIA slot and card etc. Software and data transferred via a communications interface 816 are in the form of signals which may be electromagnetic, electronic, optical or other signals capable of being received by the communications interface 816. The signals are provided to communications interface 816 via a communications path (not shown) such as a wire or cable, fibre optics, phone line, cellular phone link, radio frequency or other communications channels.

The computer system 106 will also include one or more user interfaces, such as user interface 818. User interface 818 allows a user to interact with the programmed computer 106 in the above described manner. The user interface 818 may include a keyboard interface, a display (such as an LCD display) interface, a mouse interface, a trackball interface, a touch surface interface etc.

Finally, it will be understood that there may be other variations and modifications to the configurations described herein that are also within the scope of the present invention.

The invention claimed is:

1. A method of designing and/or selecting a progressive addition lens design for a wearer, the method including:
   displaying a graphical representation of an initial progressive addition lens design including design parameters having design values, wherein the initial progressive addition lens design is selected from a plurality of progressive addition lens designs based on the design values;
   providing a user interface including, for each of one or more of the design parameters, a dynamically adjustable graphical control that is adjustable over a range of levels, each level in the range being associated with a corresponding value of the respective design parameter;
   adjusting a dynamically adjustable graphical control to select a level; and
   processing the selection to substantially simultaneously update the displayed graphical representation to provide a modified progressive lens design selected from the plurality of progressive addition lens designs based on the selected level.

2. A method according to claim 1 wherein a control is provided for three or more design parameters selected from:
   (a) distance zone area;
   (b) near zone area;
   (c) corridor length;
   (d) distance-near zone size balance;
   (e) near point inset;
   (f) blur gradients; and
   (g) foveal-peripheral zone size balance.

3. A method according to claim 1 wherein the graphical representation of the initial progressive addition lens design includes one or more of:
   (a) a contour plot of astigmatism; and
   (b) a contour plot of refracting power.

4. A method according to claim 3 wherein the contour plot of refracting power includes a contour plot selected from:
   (a) sagittal refracting power;
   (b) tangential refracting power; and
   (c) mean refracting power.

5. A method according to claim 4 wherein the contour plot is for a front or rear surface of the progressive surface lens design.

6. A method according to claim 1 wherein the user interface is a graphical user interface.

7. A method according to claim 1 wherein the scale is a quantised scale, and wherein the control is manipulable to select a quantised level from within the scale.

8. A method according to claim 1 wherein the modified progressive addition lens design is selected from an array of progressive addition lens designs according to the level selection.

9. A method according to claim 1 wherein the processing of the level selection for any one of the controls includes processing the range of levels for the other controls and modifying those ranges so as to restrict the respective range of levels in accordance with the level selection.

10. A method according to claim 1 wherein the modified progressive addition lens design is manufacturable without performing further optimisation.

11. A method according to claim 1 wherein the step of processing the selection to substantially simultaneously update the graphical representation occurs in response to an adjustment of the control.

12. A method according to claim 1 wherein the step of processing the selection includes the step of morphing the initial progressive lens design to provide the modified progressive lens design.

13. A system for designing and/or selecting a progressive addition lens design for a wearer, the system including processor and associated memory device for storing a series of instructions to cause the processor to:
   displaying a graphic representation of an initial progressive addition lens design including design parameters having design values, wherein the initial progressive addition lens design is selected from a plurality of progressive addition lens designs based on the design values;
   provide a user interface including, for each of one or more of the design parameters, a dynamically adjustable graphical control that is adjustable over a range of levels, each level in the range being associated with a corresponding value of the respective design parameter;
   receive a user input for an adjustment of a dynamically adjustable graphical control to select a level; and
   process the selection to substantially simultaneously update the displayed graphic representation to provide a modified progressive lens design selected from the plurality of progressive addition lens designs based on the selected level.

14. A non-transitory computer readable medium including a series of computer or processor executable instructions to cause a computer or processor to:
   display a graphical representation of an initial progressive addition lens design including design parameters having design values, wherein the initial progressive addition lens design is selected from a plurality of progressive addition lens designs based on the design values;
   provide a user interface including, for each of one or more of the design parameters, a dynamically adjustable graphical control that is adjustable over a range of levels, each level in the range being associated with a corresponding value of the respective design parameter;
   receive a user input for an adjustment of a dynamically adjustable graphical control to select a level; and
   process the selection to substantially simultaneously update the displayed graphical representation to provide a modified progressive lens design selected from the plurality of progressive addition lens designs based on the selected level.

15. A progressive addition ophthalmic lens selected and/or designed in accordance with a method comprising the following steps:
- displaying a graphical representation of an initial progressive addition lens design including design parameters having design values, wherein the initial progressive addition lens design is selected from a plurality of progressive addition lens designs based on the design values;
- providing a user interface including, for each of one or more of the design parameters, a dynamically adjustable graphical control that is adjustable over a range of levels, each level in the range being associated with a corresponding value of the respective design parameter;
- adjusting a dynamically adjustable graphical control to select a level; and
- processing the selection to substantially simultaneously update the displayed graphical representation to provide a modified progressive lens design selected from the plurality of progressive addition lens designs based on the selected level.

* * * * *